United States Patent
Quinton et al.

(10) Patent No.: US 9,564,883 B1
(45) Date of Patent: Feb. 7, 2017

(54) CIRCUITRY AND METHOD FOR TIMING SPECULATION VIA TOGGLING FUNCTIONAL CRITICAL PATHS

(71) Applicant: Abreezio, LLC, Sunnyvale, CA (US)

(72) Inventors: Bradley Quinton, Vancouver (CA); Trent McClements, Burnaby (CA); Andrew Hughes, Vancouver (CA); Sanjiv Taneja, Cupertino, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 14/791,443

(22) Filed: Jul. 4, 2015

Related U.S. Application Data

(60) Provisional application No. 62/146,412, filed on Apr. 13, 2015, provisional application No. 62/146,414, filed on Apr. 13, 2015.

(51) Int. Cl.
  *H03K 5/13* (2014.01)
  *H03K 5/00* (2006.01)
(52) U.S. Cl.
  CPC ....... *H03K 5/13* (2013.01); *H03K 2005/00019* (2013.01)
(58) Field of Classification Search
  USPC ........ 327/530, 538, 540, 545; 716/106, 108, 716/112–113
  See application file for complete search history.

(56) References Cited

U.S. PATENT DOCUMENTS

| | | | |
|---|---|---|---|
| 8,497,694 B2* | 7/2013 | Chua-Eoan | G01R 29/26 324/750.15 |
| 8,745,561 B1 | 6/2014 | Garg et al. | |
| 8,769,470 B2 | 7/2014 | Dai et al. | |
| 8,860,502 B2* | 10/2014 | Gemmeke | G06F 1/324 327/113 |
| 2009/0031268 A1* | 1/2009 | Miranda | G06F 17/5031 716/113 |
| 2011/0055781 A1 | 3/2011 | Potkonjak | |

* cited by examiner

*Primary Examiner* — An Luu
(74) *Attorney, Agent, or Firm* — Smith Tempel Blaha LLC

(57) ABSTRACT

Toggling functional critical path timing sensors measure delays in toggling functional critical paths that are replicas of actual critical paths or representations of worst-case delay paths. A Toggle flip-flop or Linear-Feedback-Shift Register (LFSR) drives high-transition-density test patterns to the toggling functional critical paths. When a toggling functional critical path's delay fails to meet set-up timing requirement to a next register, the toggling functional critical path timing sensors signal a controller to increase VDD. When no failures occur over a period of time, the controller decreases VDD. A margin delay buffer adds a delay to the toggling functional critical path before being clocked into an early capture flip-flop. A reference register receives the test pattern without the delay of the toggling functional critical path, and an exclusive-OR (XOR) gate compares outputs of reference and early capture flip-flops to generate timing failure signals to the controller.

20 Claims, 9 Drawing Sheets

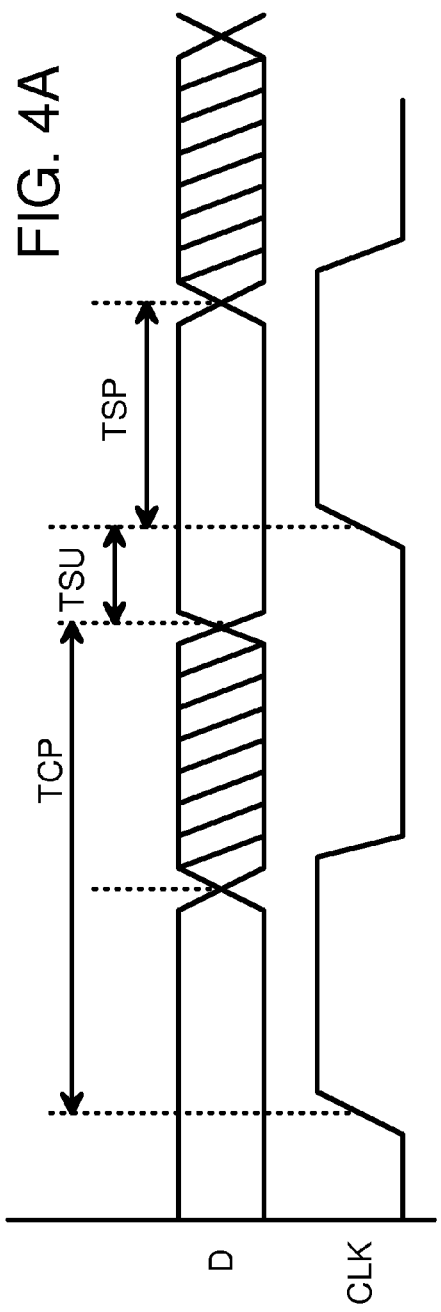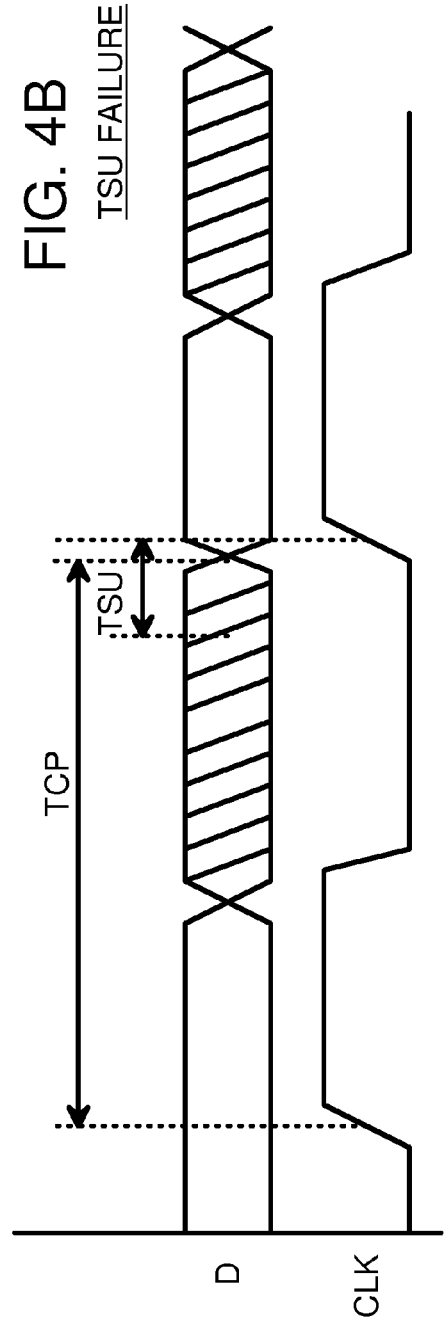

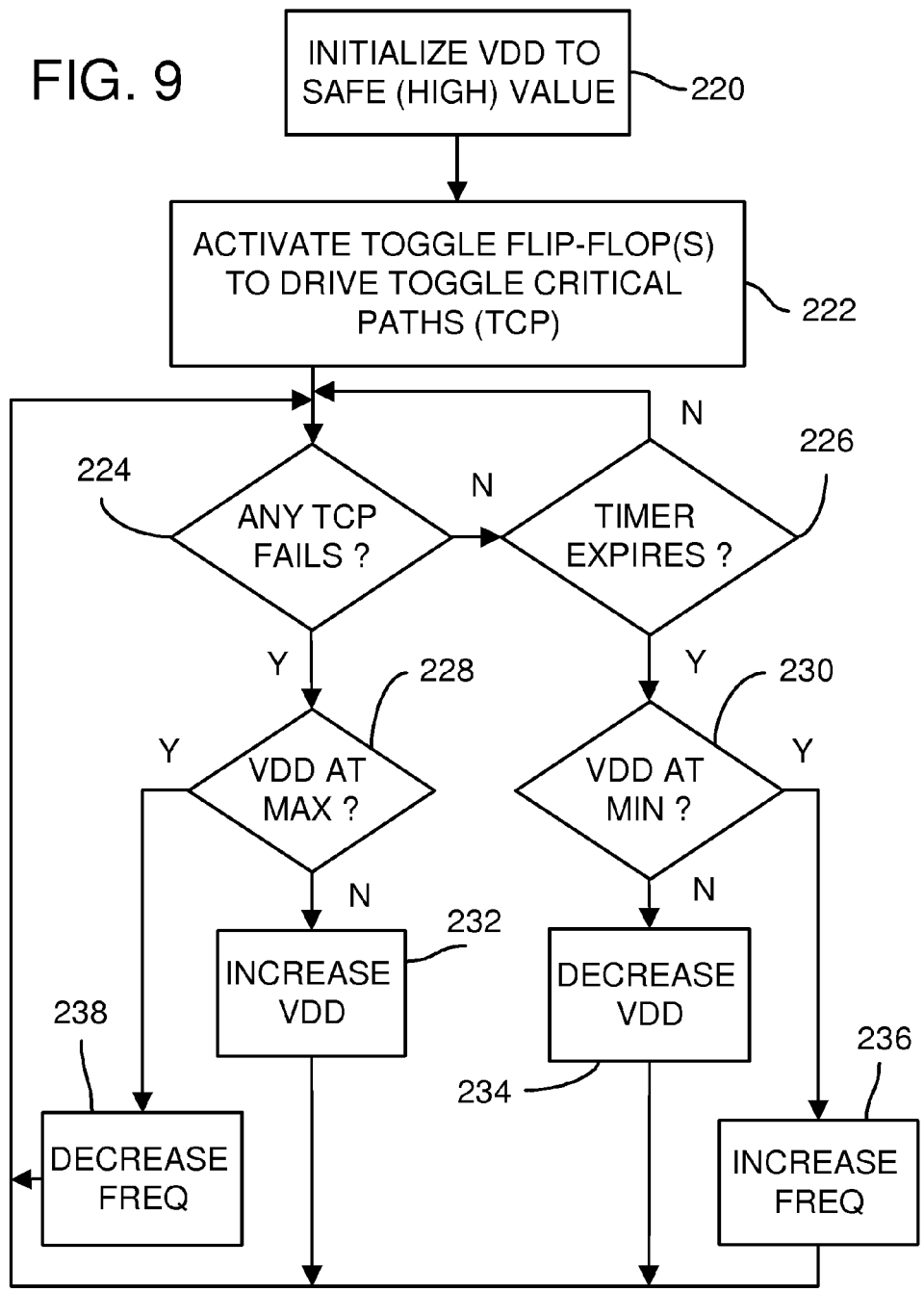

CIRCUITRY AND METHOD FOR TIMING SPECULATION VIA TOGGLING FUNCTIONAL CRITICAL PATHS

RELATED APPLICATION

This application is a non-provisional of the provisional applications for "Circuitry and Method for Critical Path Timing Speculation using Edge Sensitive Sampling". U.S. Ser. No. 62/146,412, filed Apr. 13, 2015, and "Circuitry and Method for Timing Speculation Via Toggling Functional Critical Paths", U.S. Ser. No. 62/146,414, filed Apr. 13, 2015.

FIELD OF THE INVENTION

This invention relates to on-chip sensors, and more particularly to applying high-transition-density inputs to critical paths to sense timing delays.

BACKGROUND OF THE INVENTION

Semiconductor devices are specified (spec'ed) to operate within certain parameters, such as a maximum power draw and a maximum clock frequency. While semiconductor manufacturing processes are very precise, process variations do occur. Although the manufacturing process may target a typical device, sometimes process variations produce slower chips or faster chips. As device sizes shrink, larger relative variations may occur.

Chips may be tested to determine their power draw and speed, and these chips may be sorted into slow-chip bins, fast-chip bins, and typical-chip bins. The faster chips may be sold as faster speed grades, while the slower chips may be sold for slower speed grades. Unfortunately, such process skews are not always reproducible or planned but may occur randomly, making for logistical difficulties. Therefore all process skews are often lumped together. The slowest expected process skews determine the specified speed of the device, while the fastest expected process skews determine the specified maximum power dissipation.

FIG. 1 is a graph showing how process variations affect device specifications. The slowest process skew (SS) has the lowest power and the lowest performance or speed. A typical process (TT) has a better power and performance product. The fastest process skew (FF) has the highest performance and speed, but also consumes the most power.

All three process skews—slow, typical, and fast, share the same device specifications when no grade sorting is performed. Devices produced with the slowest process determine the speed specs such as the maximum clock frequency, or the minimum clock-to-output delay times. However, the fast devices consume more power than do the slower devices, so power specs are determined by devices manufactured by the fast process skews. The power-supply voltage VDD is usually fixed.

The performance and power specs are determined by the worst-case devices over the expected process skews. Slow devices set the speed specs and fast devices set the power specs. This is not optimal, since fast devices are spec'ed slower than they can actually operate, and slow devices actually draw less power than spec'ed.

Specialized sensors may be added to chips to facilitate at-speed testing. Dummy bit lines have been added to RAM arrays to adjust bit-line sensing circuits. An oscillator or a canary circuit may be added to track process variations. However, the actual circuit may be much more complex than an oscillator, resulting in tracking errors. For logic chips, a dummy path and an on-chip timing sensor may be added. The timing sensor can report its results to a tester or even to an on-chip controller that can adjust operating conditions, such as to slow down or stop a clock to reduce power consumption.

Actual critical paths may be used during normal chip operation to detect timing failures. However, there may be few transitions during long periods of time of normal chip operation. Some critical paths may not transition for many seconds or minutes, and some may not transition at all for very long periods of time. Sensing timing failures cannot occur without transitions that pass through the critical paths.

Test modes may also be used to test critical paths. However, the test modes may have significant overhead. Test data may need to be scanned in serially to a long chain of registers, then the critical path tested, and then results serially scanned out of a long chain of registers before the results are available. Again, a long delay occurs before sensor results may be used to adjust operating conditions. This time lag is undesirable.

What is desired is to ensure that many transitions occur in a critical path to allow for sensing of timing failures. It is desired to replicate critical paths and apply test patterns to these critical paths to ensure a high transition density. It is desired to use the sensing results to adjust VDD to compensate for the actual temperature, process, and voltage conditions of the replicated critical path. It is also desired to use both replicated critical paths and representational critical paths.

BRIEF DESCRIPTION OF THE DRAWINGS

FIGS. 4A-B are timing diagrams showing critical-path timing success and failure.

FIG. 9 is a flowchart of operation of controller 130.

DETAILED DESCRIPTION

The present invention relates to an improvement in timing sensors. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors realize that test data patterns that have high transition density can be applied to a dummy path, and the speed of that dummy path can be measured. Transitions are required for sensors to detect timing failures. When no transitions occur, timing failures are not detectable. Having many transitions allows the path to be tested more often and regularly, without the dependency on fickle operating or user data. The sensor results may be used to speed up or slow down the chip by adjusting power-supply voltage VDD. Process skews cause timing variations in the functional critical paths which are measured by the sensors and then compensated for by adjusting VDD.

Figure 2:
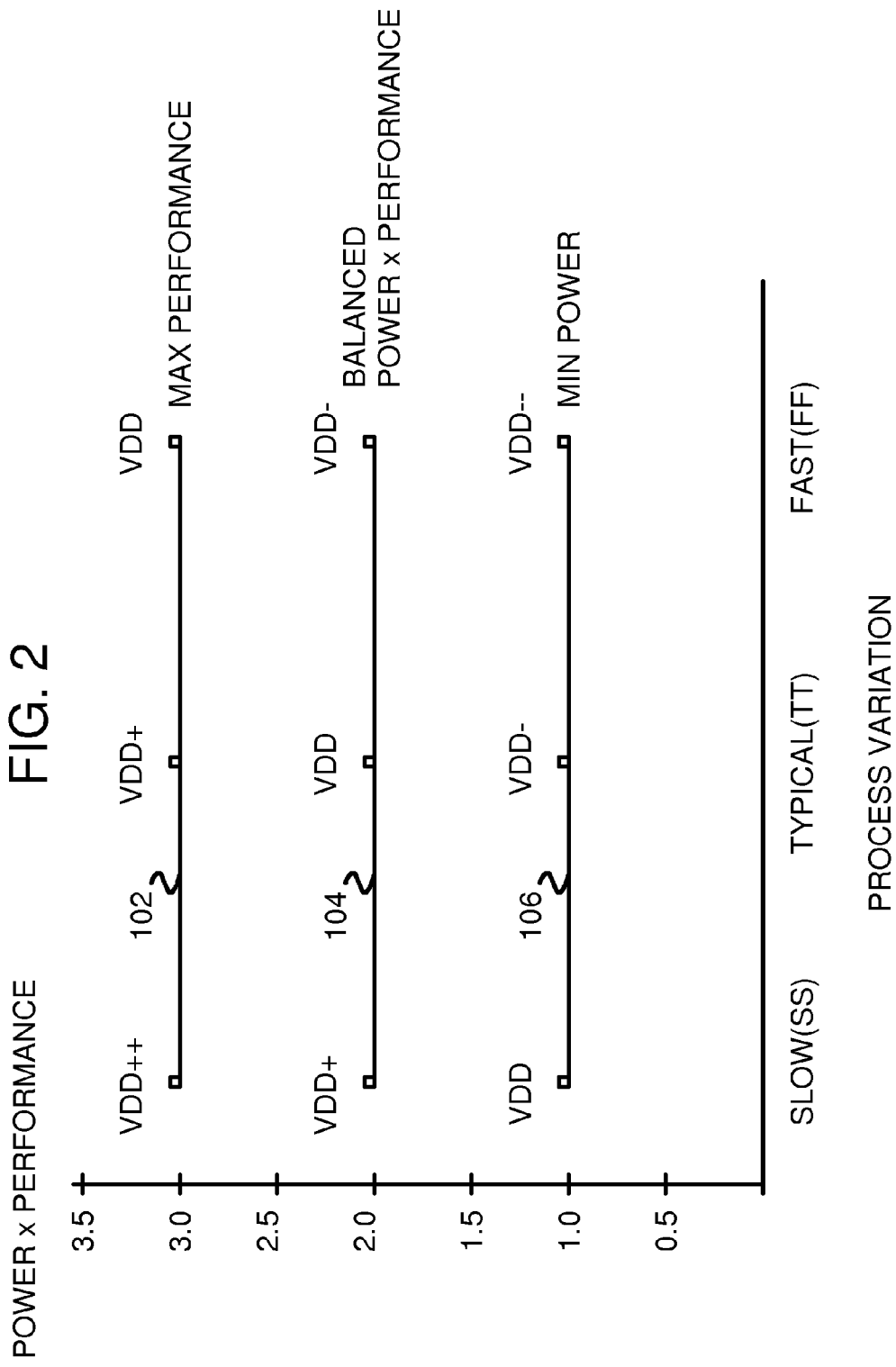
FIG. 2 is a graph showing adjusting VDD to compensate for process skews.

FIG. 2 is a graph showing adjusting VDD to compensate for process skews. On-chip sensors accurately measure timing delays in functional critical paths. Since the actual critical-path delays are precisely measured, less of a guard band is needed in the chip specifications. Process skews are accurately accounted for, so either the performance or the power spec may be increased. Since timing sensors are receiving input patterns with many transitions, the critical paths are being sensed frequently, allowing adjustments to be made as needed. Less of a guard band is needed when the manufacturer specs the chip.

When lifetime performance is maximized, curve 102 shows that the fast process skew chips are powered by VDD and determine the performance specs. The internal power supply to the typical chip is increased to VDD+ to increase its performance to match the performance of the fast-process chip. The internal power supply to the slow-process chip is increased further to VDD++ so the slow-process chip can also meet the timing spec of the fast-process chip. Since the maximum power consumption spec is determined by the fast-process chip operating at VDD (See FIG. 1), the typical and slow chips will consume less than the spec'ed power when powered at VDD. The amount of increase in VDD to VDD+ and VDD++ can be chosen so that the maximum power spec is not exceeded. Thus the slow and typical chips still consume less than the spec'ed power but also have increased performance using curve 102.

Figure 1:
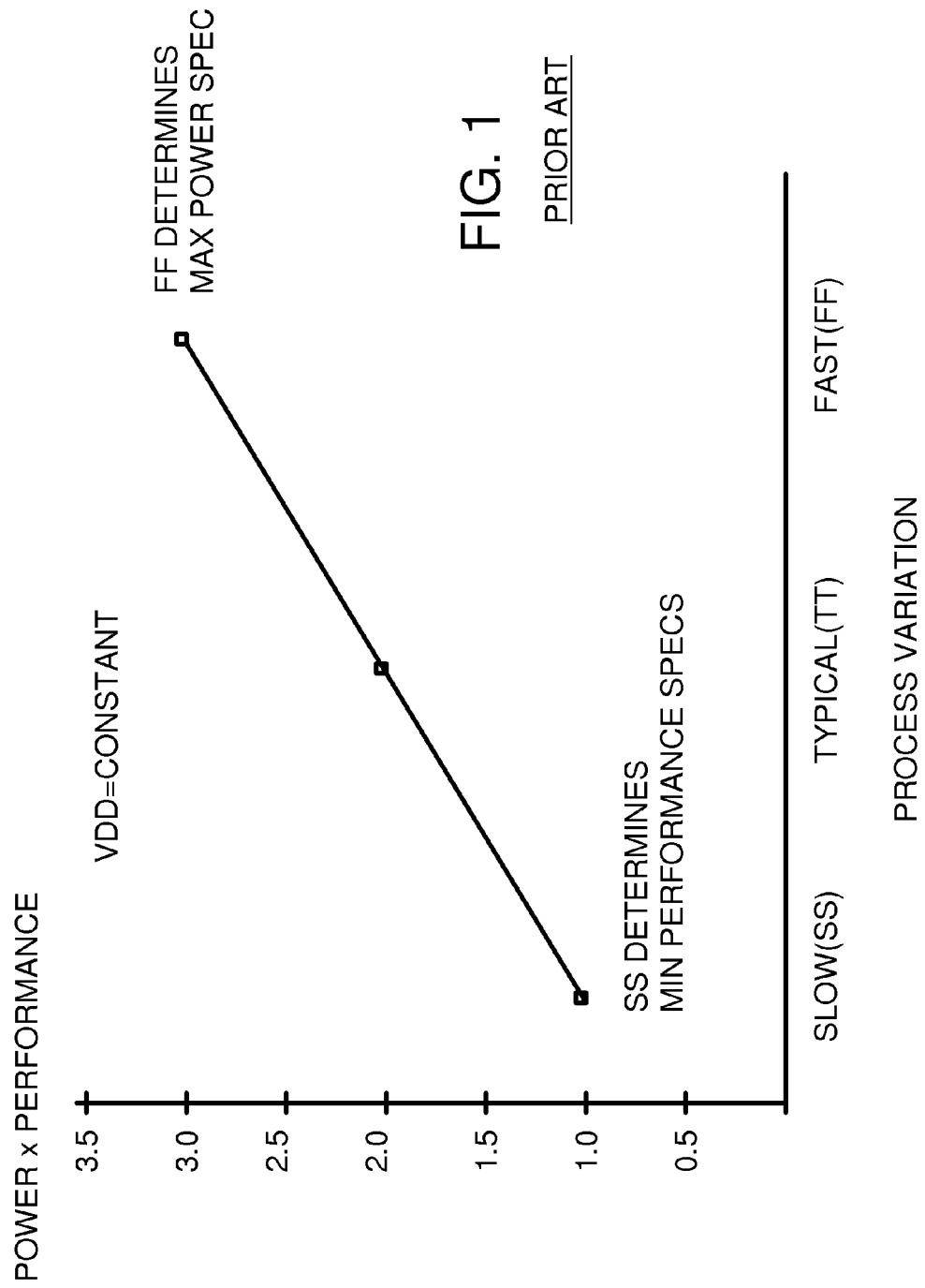
FIG. 1 is a graph showing how process variations affect device specifications.

When reducing power is more important that increasing performance, such as for battery-powered applications, curve 106 is used. The slow-process chip is powered by VDD and sets the performance specs (FIG. 1). However, since the typical and fast-process chips are inherently faster at the same nominal VDD, their internal power supplies are decreased to VDD− and VDD−− so that the same performance spec is reached but power consumption is reduced.

Curve 104 shows a balanced approach. When the internal critical-path sensors determine that the chip was made using a typical process, this typical-process chip is powered with the nominal VDD. Power is less than the maximum spec'ed by the fast-process chips and performance is better than the minimum spec'ed by the slow-process chips.

When the critical-path timing sensors determine that the chip is a fast-process chip, the internal VDD is reduced to VDD−. This reduces power consumption while maintaining performance. When the critical-path timing sensors determine that the chip is a slow-process chip, the internal VDD is raised to VDD+. This increases performance while maintaining power consumption.

Thus by measuring the timing of toggling critical paths, the internal power supply to internal circuits is adjusted up or down to compensate for process skews. The chip may operate at higher performance or power may be saved. Thus chip operation is optimized for the process skew that the chip was manufactured with, and for reduced performance as the chip ages over its lifetime.

Figure 3:
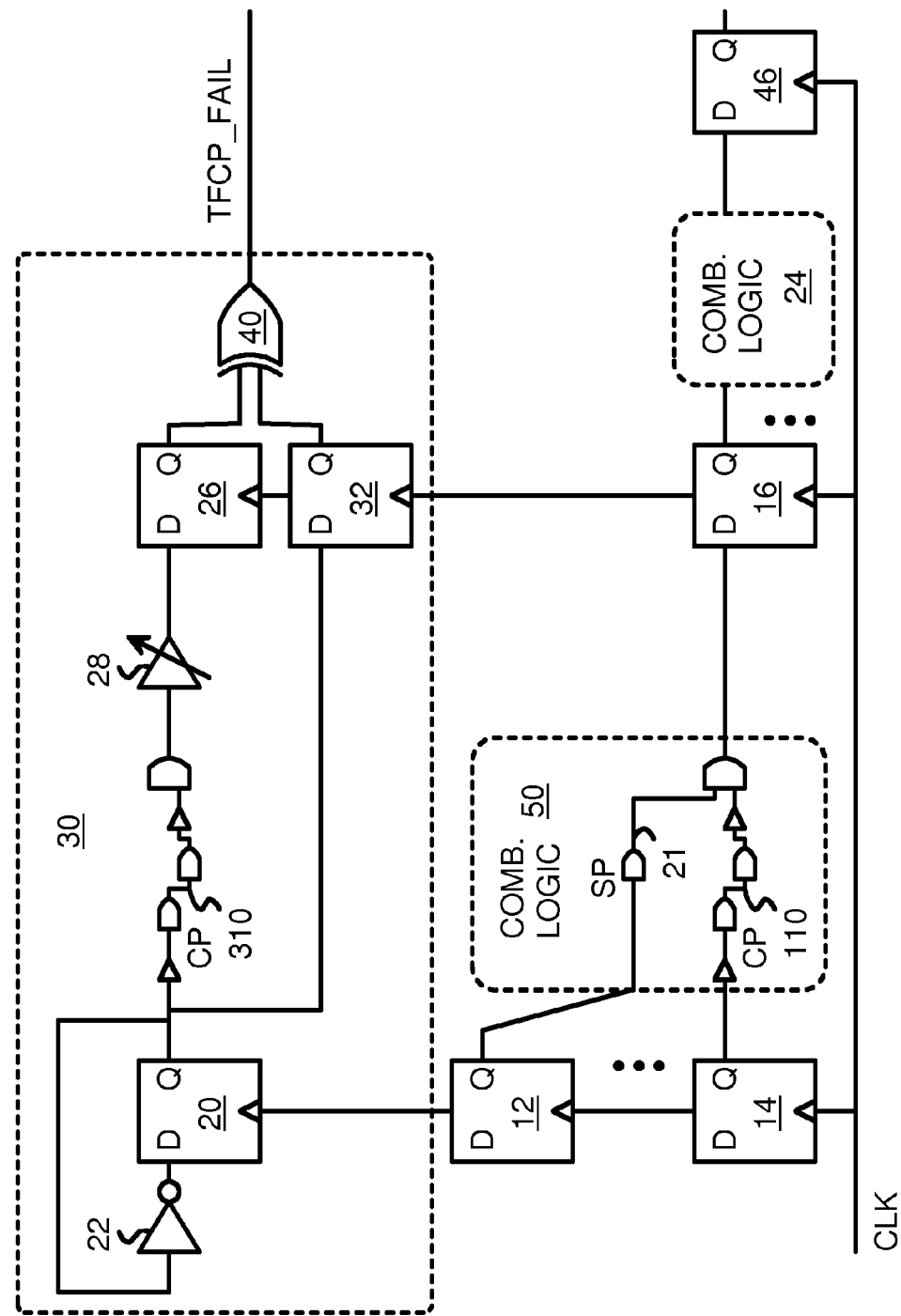
FIG. 3 is a schematic of toggling functional critical paths and their timing sensors.

FIG. 3 is a schematic of toggling functional critical paths and their timing sensors. Toggling sensor 30 may be physically located close to combinatorial logic 50 and functional critical path 110, but does not carry user data and is not functionally connected with the user data path. Critical path 110 is an actual functional critical path, such as a chain of logic gates between two flip-flops within a logic block powered by VDD.

Flip-flops 12, 14, 16, 46 are clocked by CLK and may have data scanned into them during a test mode, such as by using Level-Sensitive Scan Design (LSSD) and similar techniques. Combinatorial logic 50 includes logic gates between first-level flip-flops 12, 14 and next-level flip-flop 16. When the rising edge of CLK occurs, the Q outputs of first-level flip-flops 12, 14 change, and this change propagates through functional critical path 110 and short path 21 within combinatorial logic 50 to the D input of next-level flip-flop 16.

When the set-up time to next-level flip-flop 16 is met, the correct data is clocked into next-level flip-flop 16, and then passes through combinatorial logic 24 to third-level flip-flop 46. An actual circuit has many more flip-flops at each level than shown. During normal operation, data and control signals are clocked through the flip-flops. However, during a test mode the test data is scanned into the flip-flops, which may include muxes on their D inputs and/or a separate test clock (not shown).

Once the desired test data is clocked into the flip-flops, CLK is pulsed, allowing the test data from first-level flip-flops 12, 14 to flow through functional critical path 110 and short path 21 to the D input of next-level flip-flop 16. When the set-up timing requirement is met, the correct data is clocked into next-level flip-flop 16 and appears at the Q output.

Test mode is not required for timing measurements. Normal user data or other chip data and control information may or may not have a sufficient number of state changes to allow for testing, especially if several different functional critical paths are tested, or if test software selects paths with a higher frequency of state change. However, it is undesirable to have actual failures occur during normal chip operation. A test flip-flop with an added set-up-time delay may be added in parallel to flip-flop 16 to detect errors before they would occur in flip-flop 16.

A toggling pattern generator is implemented as a toggle flip-flop to maximize the frequency of state transitions. Inverter 22 inverts the Q output of toggle flip-flop 20 to drive its D input. Since the state of toggle flip-flop 20 is changing at each CLK cycle, the transition density is likely higher than any functional critical path 110 since user data rarely changes each for CLK. Thus transitions and wear are accelerated for toggling functional critical path 310 relative to functional critical path 110.

When the rising edge of CLK occurs, the Q output of toggle flip-flop 20 changes, and this change propagates through toggling functional critical path 310 and margin delay buffer 28 to the D input of margin detect flip-flop 26.

When the set-up time to margin detect flip-flop 26 is met, the correct data is clocked into margin detect flip-flop 26 and appears on its Q output. As the margin delay of margin delay buffer 28 is increased, eventually the set-up time is violated and the wrong data is clocked into margin detect flip-flop 26.

The Q output of toggle flip-flop 20 is applied as a reference signal directly to the D input of reference flip-flop 32. Since there is little delay between toggle flip-flop 20 and reference flip-flop 32, reference flip-flop 32 always contains the correct data.

After the rising edge of CLK, the Q terminals of margin detect flip-flop 26 and reference flip-flop 32 should be identical. However, if the set-up timing failed, the wrong data is clocked into margin detect flip-flop 26, at the Q terminals likely have different data.

XOR gate 40 compares the Q terminals of margin detect flip-flop 26 and reference flip-flop 32 and signals a timing failure when they are different. When the Q terminals are not in the same state, a failure is detected by XOR gate 40, which generates the toggling functional critical path timing failure signal TFCP_FAIL.

FIGS. 4A-B are timing diagrams showing critical-path timing success and failure. In FIG. 4A, the D input to a D-type flip-flop receives a signal generated by functional critical path 110 of FIG. 3. The flip-flops are clocked by the rising edge of clock CLK. When CLK rises, data from the outputs of upstream flip-flops travel through various paths to the inputs of the next logical level of flip-flops. The changing signals must propagate through the various paths and arrive at the D inputs of the next level of flip-flops at least a set-up time TSU before the next rising edge of CLK. The slowest path is the critical path that has a delay of TCP.

Several other paths may converge with this critical path. The fastest of these converging paths has a shortest path delay of TSP. After each rising clock edge of CLK, the D input to the next level of flip-flop can begin to change TSP after the CLK edge, and may continue to change until TCP. In FIG. 4A, TCP occurs just before the required TSU, so timing does not fail. The correct data is clocked into the next-level flip-flop.

In FIG. 4B, a timing failure occurs. The clock may be running at a higher frequency in FIG. 4B than in FIG. 4A, a lower VDD, a higher temperature, a slower-process chip may be shown, or the chip may have aged or otherwise degraded.

The critical path delay TCP is larger relative to the clock period so that the D input is still changing after TSU. The correct data through the critical path does not arrive at D until after TSU, so the wrong data may get clocked into the next-level flip-flop. A set-up timing error occurs.

Margin delay buffer 28 adds an extra delay to make the required TSU larger for toggling functional critical path 310 to early capture flip-flop 26 than for functional critical path 110 to next-level flip-flop 16. The extra delay from margin delay buffer 28 adds a level of protection or guard band, allowing failures to be detected earlier before they affect normal circuit operation.

Figure 5:
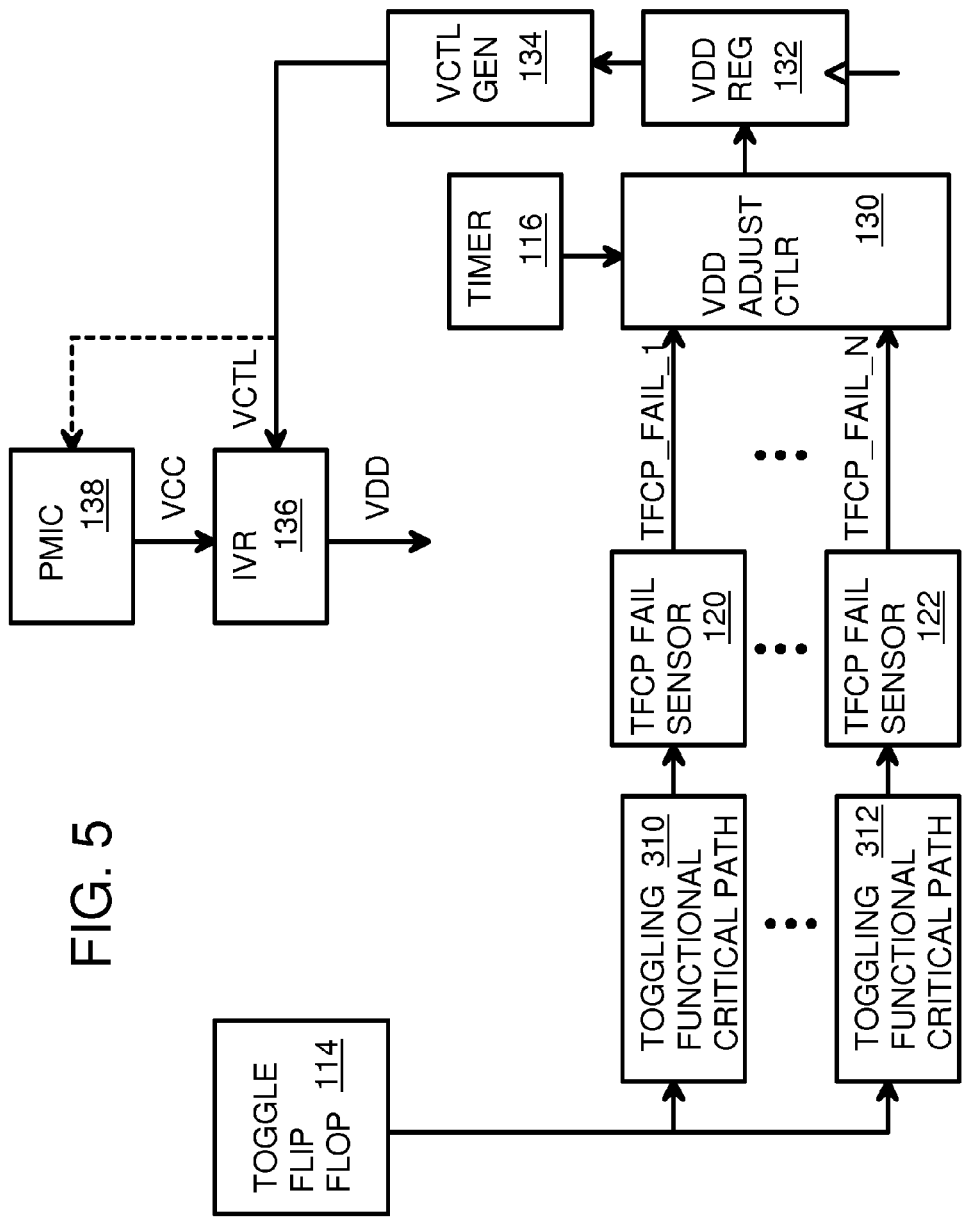
FIG. 5 is a block diagram with a controller that adjusts the internal power supply in response to toggling functional critical path timing measurements.

FIG. 5 is a block diagram with a controller that adjusts the internal power supply in response to toggling functional critical path timing measurements.

Toggle flip-flop 114 is a pattern generator that generates test patterns that have a high transition density. High-transition density patterns improve the responsiveness of the timing sensors, since a state transition is needed to detect a set-up timing failure. The toggling test patterns are input to toggling functional critical paths 310, . . . 312. Toggling functional critical paths 310, . . . 312 are dummy paths that do not carry user data or chip controls. Thus failure of toggling functional critical paths 310, . . . 312 does not cause chip operation to fail.

The toggling test patterns pass through toggling functional critical paths 310, . . . 312 and are sensed by toggling functional critical path timing sensors 120, . . . 122. Failure signals TFCP_FAIL_1, TFCP_FAIL_2, . . . TFCP_FAIL_N are generated by toggling functional critical path timing sensors 120, . . . 122 when the toggling test patterns do not meet the set-up time requirements.

Controller 130 receives the timing failure signals from toggling functional critical path timing sensors 120, 122 and signals adjustments for VDD. When one or more valid timing failure signals are received, controller 130 increases VDD by some increment by writing a larger value into VDD register 132. When no timing failure signals are received during a period of time set by timer 116, controller 130 may decrease VDD by writing a smaller value to VDD register 132. Controller 130 may use various routines and procedures to test out different VDD voltages and then to back away from a level of VDD that causes failures to provide a guard band.

Power Management Integrated Circuit (PMIC) 138 is an external IC that generates a VCC power supply applied to a chip. Integrated Voltage Regulator (IVR) 136 receives VCC on an external pin and generates a regulated internal power supply voltage VDD. IVR 136 could be a Low-Drop Out (LDO) regulator or a Switching Mode Power Supply (SMPS) regulator that are on the substrate with toggling functional critical paths 310, . . . 312 and supply VDD to all internal components within the same voltage domain.

The digital value in VDD register 132 is converted to an analog voltage by VCTL control voltage generator 134. This control voltage VCTL is applied to an analog control voltage input to either internal IVR 136 or to external PMIC 138. Control voltage VCTL causes IVR 136 or PMIC 138 to adjust the VDD or VCC generated. Thus controller 130 adjusts VDD in response to timing failure signals from toggling functional critical path timing sensors 120, 122. The adjusted VDD is applied to all components in the voltage domain, such as toggling functional critical paths 310, . . . 312, toggling functional critical path timing sensors 120, . . . 122, controller 130, VDD register 132, and VCTL control voltage generator 134.

Figure 6:
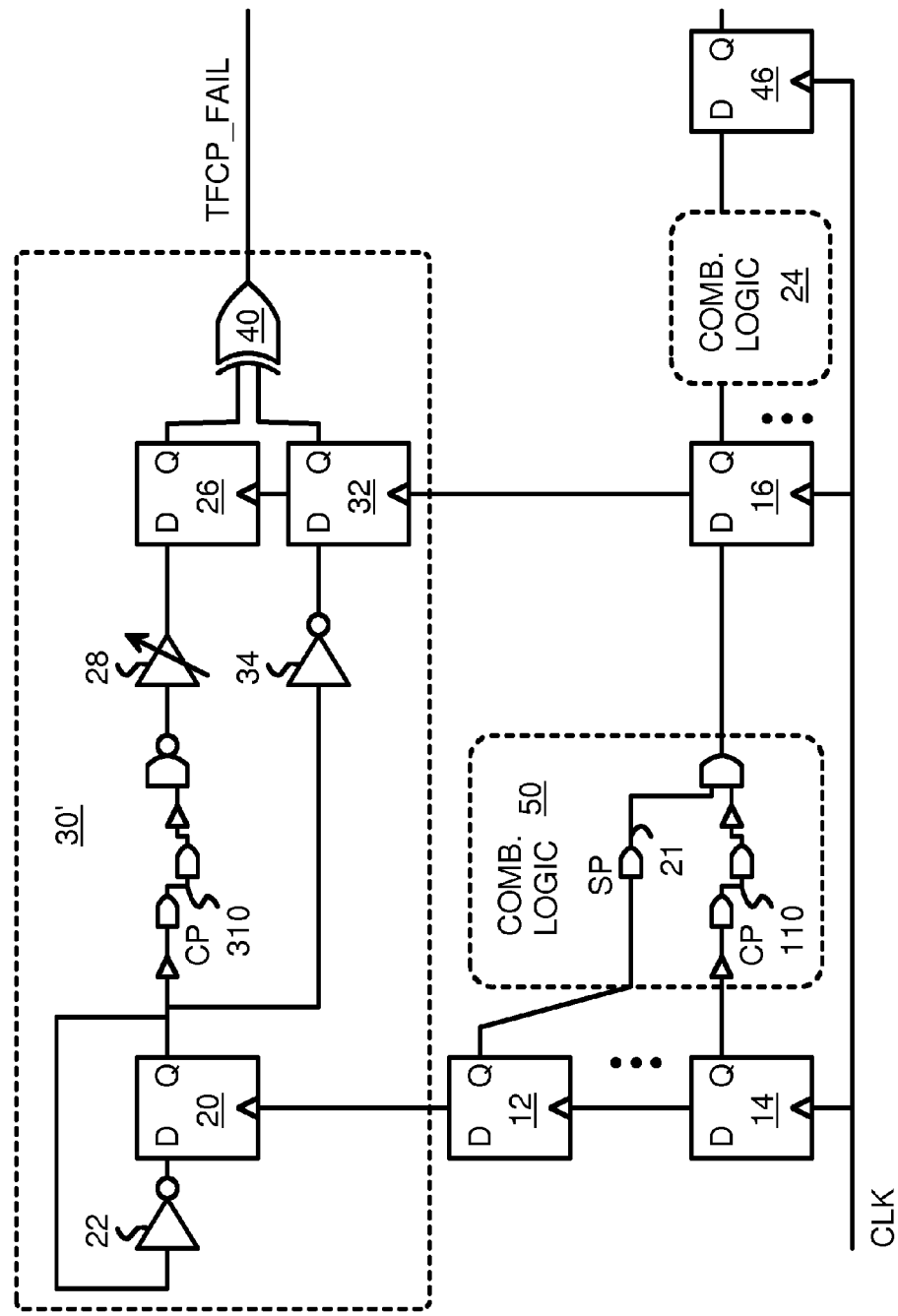
FIG. 6 is a schematic of an inverting toggling functional critical path and its timing sensor.

FIG. 6 is a schematic of an inverting toggling functional critical path and its timing sensor. Toggling functional critical path 310 is an inverting path, so inverter 34 is added to the reference path to reference flip-flop 32. Toggling sensor 30' allows critical paths that are net inversions to be tested. Alternately, XOR gate 40 could be changed to an XNOR gate rather than add inverter 34.

Figure 7:
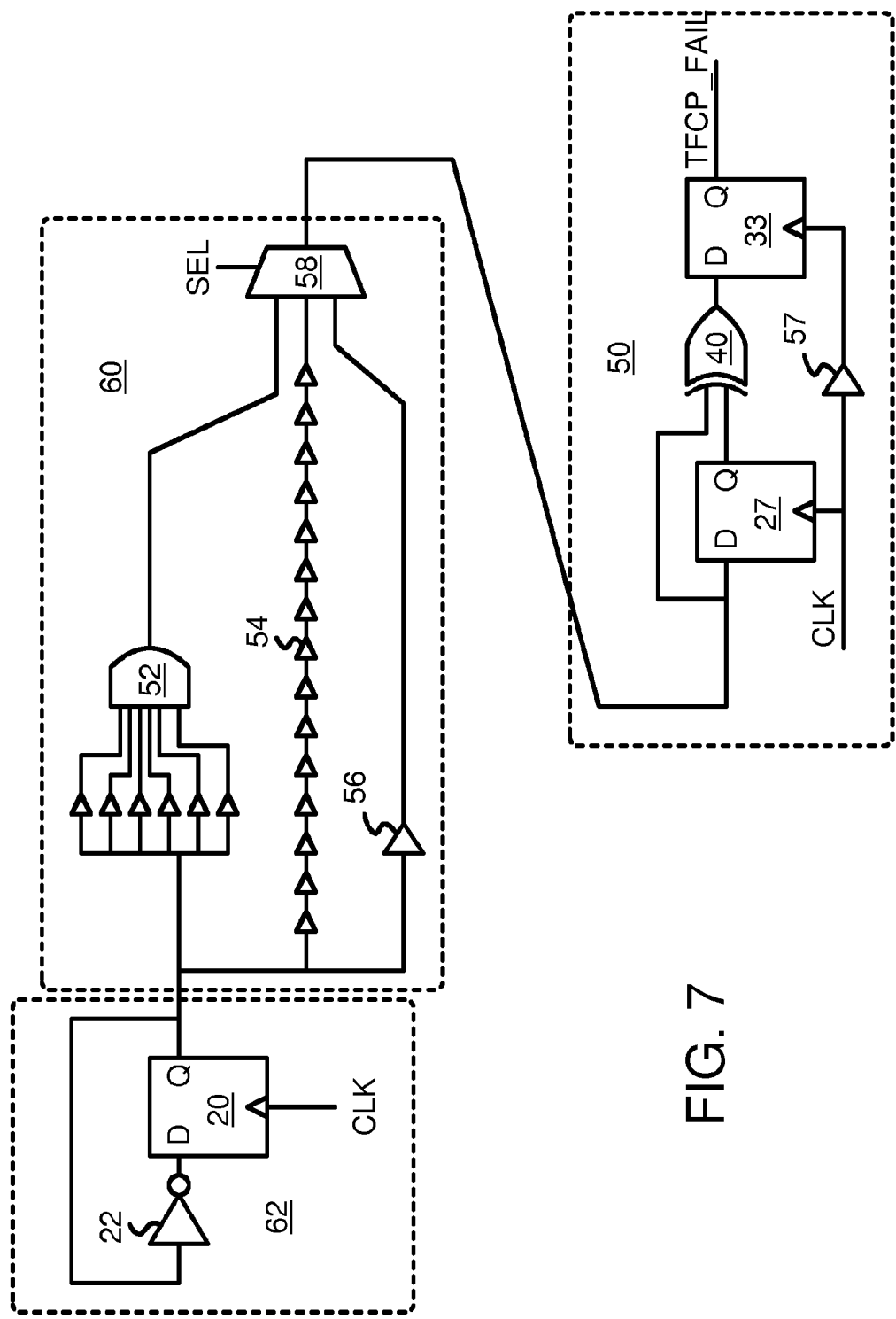
FIG. 7 shows a representational toggling functional critical path.

FIG. 7 shows a representational toggling functional critical path. Toggling functional critical path 310 (FIGS. 3, 6) may be an exact gate-for-gate replica of the logic of a functional critical path, such as functional critical path 110 (FIG. 3). The fanout, gate sizes and combinations, wire lengths, loading, and even orientation and location can be matched as closely as possible. Unused inputs to logic gates can be tied high or low to allow the toggling pattern data to pass through the logic gates in toggling functional critical paths 310.

Toggling functional critical path 310 may also be a representational path that represents the expected worst-case loading, fanout, and delays. In FIG. 7, a pattern generator is implemented as toggling flip-flop 62 with inverter 22 that inverts the Q output of flip-flop 20 to drive its D input. The Q output of flip-flop 20 drives representational toggling functional critical path 60. Representational toggling functional critical path 60 has a high fanout to many buffers to the many inputs of AND gate 52, which drives one input of mux 58. Another input of mux 58 is driven by a long string of delay inverters 54, while a third input of mux 58 is driven by larger buffer 56. All three paths are driven by toggling flip-flop 62. Software or controller 130 can select one of the three paths for testing through the select SEL input of mux 58.

The output of mux 58 is clocked into detect flip-flop 27. When the delay through the path selected by mux 58 is too slow to meet the set-up time, the wrong data is clocked into detect flip-flop 27, and XOR gate 40 detects that the D and Q terminals of detect flip-flop 27 differ. A high is clocked into failure flip-flop 33 to cause toggling functional critical path timing sensor 50 to signal TFCP_FAIL to controller 130. Buffer 57 delays CLK to failure flip-flop 33.

Figure 8:
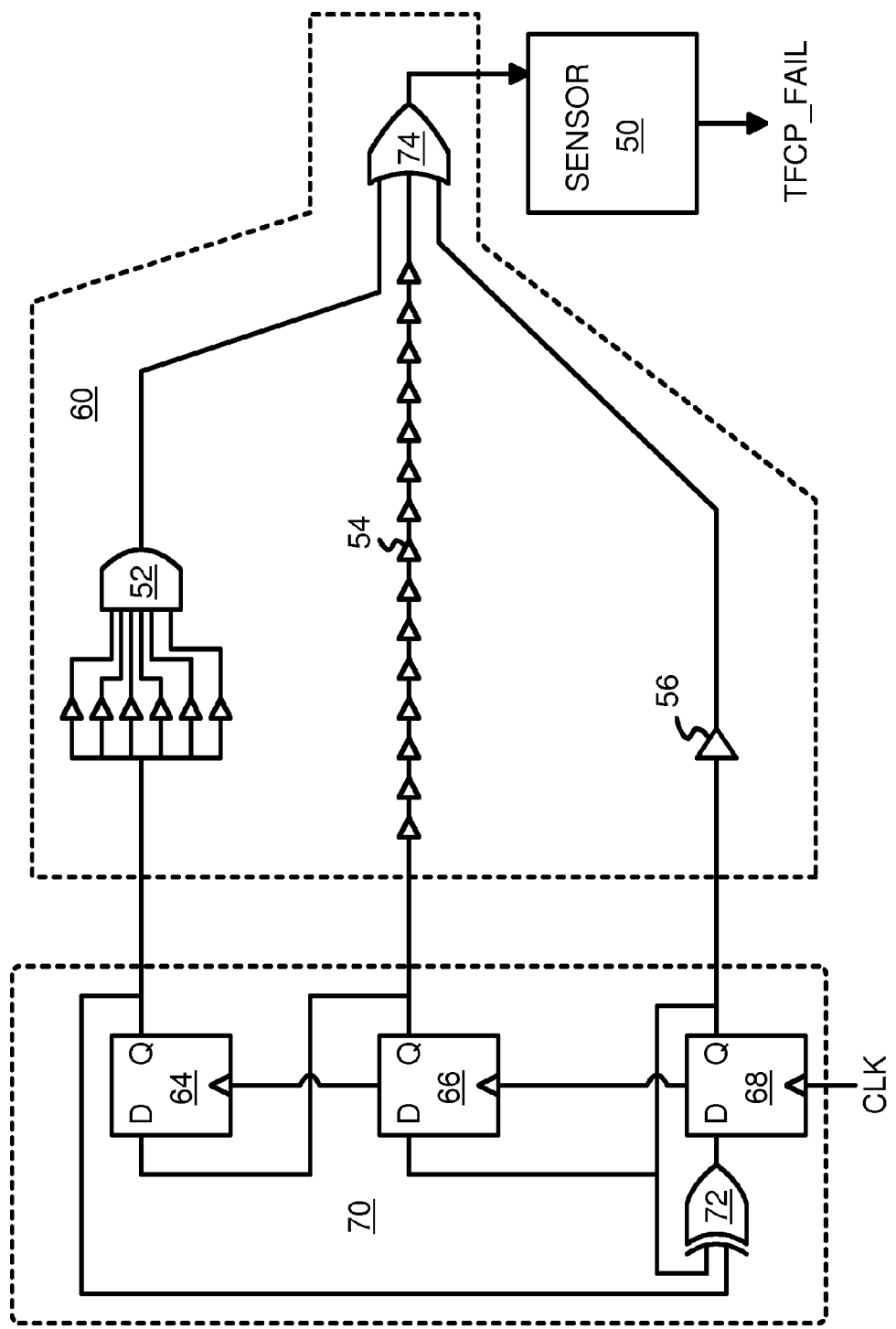
FIG. 8 shows another representational toggling functional critical path.

FIG. 8 shows another representational toggling functional critical path. A pattern generator is implemented as a Linear-Feedback Shift Register (LFSR). LFSR 70 has three flip-flops 64, 66, 68 which generate 3 outputs that drive the three paths of representational toggling functional critical path 60. Third LFSR flip-flop 64 drives the upper path to AND gate 52, second LFSR flip-flop 66 drives the middle path to long string of delay inverters 54, while first LFSR flip-flop 68 drives the lower path to larger buffer 56. XOR gate 72 combines the Q outputs of first LFSR flip-flop 68 and third LFSR flip-flop 64 to drive the D input to first LFSR flip-flop 68. The D input of second LFSR flip-flop 66 receives the Q output of first LFSR flip-flop 68, while the D input of third LFSR flip-flop 68 receives the Q output of second LFSR flip-flop 66.

The three paths in representational toggling functional critical path 60 are logically combined by OR gate 74 to drive toggling functional critical path timing sensor 50.

LFSR 70 still provides a high toggling density, but provides a greater variety of input stimuli to the multiple paths that are combined by OR gate 74.

FIG. 9 is a flowchart of operation of controller 130. Periodically, such as once per calendar month, or after a predetermined number of hours of operation, or at each startup, or some other trigger, controller 130 is activated, to measure timing delays in toggling functional critical paths 310, . . . 312 and to correct VDD. Alternately, controller 130 may run continuously, and the routine of FIG. 9 be repeated in an endless loop.

An initial value for VDD is selected, step 220. This initial VDD value may be a high value for VDD or other value considered as safe. Alternately, the initial VDD value may be a midpoint value or an endpoint of a range.

Toggling flip-flop 62 or another pattern generator is activated to generate toggling test patterns, step 222. These patterns can operate continuously when the chip is powered on.

As the toggle flip-flops or other pattern generator continues to apply toggling test patterns to toggling functional critical paths 310, . . . 312, controller 130 checks the TFCP_FAIL signals from toggling functional critical path timing sensors 120, . . . 122. When no failures occur, step 224, and the timer expires, step 226, VDD can be decreased, step 234, if not already at its minimum, step 230.

When VDD is adjusted by controller 130 during the process of FIG. 9, VDD to toggling functional critical path timing sensors 120, . . . 122 is adjusted, adding or reducing the path delays.

When controller 130 detects a TFCP_FAIL signal from toggling functional critical path timing sensors 120, . . . 122, step 224, VDD should be increased, step 232, if not already at its maximum, step 228.

The process of increasing or decreasing VDD continues until the process times out, or until the maximum or minimum VDD is reached, steps 228, 230. Then the process may end.

When the maximum VDD value is reached, step 228, then the clock frequency CLK is decreased, step 238 to eliminate timing failures. When the minimum VDD value is reached, step 230, then the clock frequency CLK is increased, step 236. The clock frequency may also have a minimum and maximum value.

Alternate Embodiments

Several other embodiments are contemplated by the inventors. For example many kinds and arrangements of logic gates are possible, including NAND, NOR, AND, OR, XOR, NXOR, etc. Rather than 2-input gates, gates with 3, 4, or more inputs may be used. Many toggling functional critical paths 310, . . . 312 may be used, each with different applied test patterns from one or more toggle flip-flops 114.

A margin delay buffer 28 could be added to the representational critical paths of FIGS. 7, 8 before sensor 50. Sensor 50 of FIGS. 7, 8 could be replaced by other kinds of toggling functional critical path timing sensors 120, and various alternatives and combinations for toggling functional critical path timing sensors 120 are possible.

The toggling functional critical paths 310, . . . 312 may differ in logic, and some may be copies of actual functional critical paths, such as functional critical path 110, while other toggling functional critical paths 310, . . . 312 may be representational, such as shown in FIGS. 7-8, with many variations in logic arrangements and loading possible.

Toggle flip-flop 114 could remain on even when the chip is suspended or put into a low-power state, or could be turned off. Many kinds of pattern generators could be used, such as LFSR, pseudo-random, feed-forward, feed-back, Galois, etc.

While a rising edge CLK has been described, flip-flops that use the falling edge of CLK or of another clock may be used. Multiple clocks may be used. While XOR gates have been shown, exclusive-NOR (XNOR) gates could be substituted with inverted output signals.

A chip could have several voltage islands or domains. One domain could be powered with one VDD voltage, while another domain could be powered with a different VDD voltage. Separate voltage domains could be used for memory arrays, logic, processors, analog circuits, and I/O. Each voltage domain could have its own functional critical paths, sensors, and VDD controller.

In FIG. 4B, a timing hazard occurs since the data clocked into the next-stage flip-flop is not guaranteed to be correct. The flip-flop could become meta-stable or unstable if the D input was at an intermediate voltage level rather than high or low, and this instability could resolve itself at some unknown time in the future. Having only one critical path sensor could be dangerous if such instability were to occur. However, having several critical paths that are sensed at the same time can reduce this danger, since each critical path has a slightly different delay.

A LSSD scan chain may include all of first-level flip-flops 12, 24, next-level flip-flop 16, and third-level flip-flop 46 (FIG. 3, etc.). The levels are arbitrary since logic signals can wrap backwards among any of the flip-flops. Combinatorial logic 50 and combinatorial logic 24 may be part of the same logic block and are shown separately as a teaching aid rather than as a real circuit division. While flip-flops 12, 14, 16, 46 have been shown using the same clock CLK, latches could be substituted. CLK could be replaced by two-phase non-overlapping clocks, with combinatorial logic between each phase latch. Registers that store state could be designed in RTL and implemented as D-type flip-flops, testable or scan-chain D-type flip-flops, muxed-input or flip-flops with a second test clock, toggle flip-flops, J-K flip-flops, transparent latches, S-R latches, and various combinations.

Measuring the delay of toggling functional critical path 310 could occur during a test mode when functional data is paused, or could be measured during normal operation when the test mode is not active. This is especially true when margin delay buffer 28 is present, since early capture flip-flop 26 in the timing sensor will fail before next-level flip-flop 16 in the functional data path. Toggle flip-flop 114 ensures that state transitions occur while normal functional data may not toggle next-level flip-flop 16 for long periods of time, depending on the functions being performed. Having many toggling functional critical paths 310, 311, . . . 312 can improve controller 130 accuracy since more paths are checked for timing.

Other kinds of flip-flops, accumulators, S-R latches, or registers may be substituted. In particular, a multi-bit accumulator could be added that counts a number of validated timing failures that have occurred since the accumulator was last cleared. Controller 130 may use the count value to determine how large of a change to make to VDD.

The delay generated by margin delay buffer 28 may be partially variable. A metal mask option may be used to set part of these delays, or the delay may be set during design after careful statistical or other analysis. These delays may have both a fixed delay component and a programmable delay component. The programmable delays may be controlled by controller 130. Controller 130 may sweep these delays across a range of increments. Controller 130 may adjust the margin delay, VDD, and the clock frequency using a closed control loop. A Delay-Locked Loop (DLL) may be used, muxes or switches to bypass a variable number of delay buffers, to add capacitance or resistance delays, or other programmable methods to allow the controller to set margin delays or other delays. The increment for the delay adjustment may be larger than the corresponding VDD increment. Controller 130 may use VDD adjustment as a finer control and margin delay adjustment as a coarse control. Ideally, the margin delay is large enough to accommodate any expected jumps in VDD due to adjustments to IVR 136 or PMIC 138.

When VDD is set too high, transistor speed may be so high that the delay through margin delay buffer 28 may be too small to distinguish between next-level flip-flop 16 and early capture flip-flop 26.

The controller could use an initial nominal VDD value and then increase VDD when no failures are detected for several cycles. VDD may be decreased when a failure occurs for a valid state change. Once a maximum or minimum VDD is reached, no further VDD changes are allowed. In some embodiments, the clock frequency then might be changed, such as by adjusting a Phase-Locked Loop (PLL) of other clock generator. VDD could be increased by larger increments than by the decrement increment, and the size of the increment could be a function of the number of timing failures detected.

Controllers may account for changes in temperature, aging or wear of the circuit, voltage drops, or other phenomena. Whatever causes speed changes in the circuit is accounted for by measuring the timing delays of toggling functional critical paths compared with set-up timing requirements to flip-flops, either with or without added timing margin.

Rather than use internal controller 130, external software or an external tester could read the results from the toggling functional critical path timing sensors, such as by reading TFCP_FAIL signals stored in an on-chip register. The external software or tester could then write a new value for VDD to VDD register 132 to adjust VDD (FIG. 5), or similarly adjust margin delays. Other combinations of internal and external control are possible.

Extra components could be added to the short paths during design synthesis to increase the width of the timing window, making the sensor design more robust. A transparent latch that prevents the short path's output form changing during the first half of the clock period could be added. This latch would increase TSP to half of a clock period. Extra components could be added to toggling functional critical paths 310, . . . 312 to increase delay for extra margin. There are limits to VDD variation, so controller 130 may adjust VDD within these limits.

Software, firmware, hardware, and various combinations may be used for sorting and selecting critical paths and for controller 130 and other components. Toggling functional critical paths 310 may be placed close to or adjacent to functional critical path 110 that they replicate. The cones of logic in paths 110, 310 may be intertwined or co-located.

Some embodiments may not use all components. For example, registers, gates, switches, etc. may be added or deleted in some embodiments. Inversions may be added by swapping inverting and non-inverting inputs as desired, but do not change the overall function and thus may be considered equivalents. Clocks may be inverted. Active-low clocks could be used that have non-overlapping low-going pulses rather than non-overlapping high-going pulses.

Capacitors, resistors, and other filter elements may be added. Gates could employ n-channel transistors, p-channel transistors, or transmission gates with parallel n-channel and p-channel transistors, or more complex circuits, either passive or active, amplifying or non-amplifying.

Additional components may be added at various nodes, such as resistors, capacitors, inductors, transistors, extra buffering, etc., and parasitic components may also be present. Enabling and disabling the circuit could be accomplished with additional transistors or in other ways. Pass-gate transistors or transmission gates could be added for isolation.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A timing-failure-predicting integrated circuit comprising:
    a toggling pattern generator that generates a toggle pattern having a high density of transitions;
    a plurality of toggling functional critical paths that receives the toggle pattern generated by the toggling pattern generator;
    a plurality of toggling functional critical path timing sensors, each receiving an output of a toggling functional critical path in the plurality of toggling functional critical paths;
    a plurality of fail signals generated by the plurality of toggling functional critical path timing sensors, wherein a fail signal is generated when a delay through a toggling functional critical path exceeds a timing requirement; and
    a VDD adjustment controller that receives the fail signals generated by the plurality of toggling functional critical path timing sensors, the VDD adjustment controller causing a power-supply voltage to the plurality of toggling functional critical paths and to the plurality of toggling functional critical path timing sensors to be increased when the fail signal is received, the VDD adjustment controller causing the power-supply voltage to be reduced when no fail signal is received for a period of time,
    wherein the power-supply voltage is adjusted to compensate for timing failures detected through the toggling functional critical paths.

2. The timing-failure-predicting integrated circuit of claim 1 wherein the timing requirement is a set-up time to a clocked register plus a margin delay of a margin delay buffer;
    wherein the fail signals are generated when delays through the toggling functional critical path plus the margin delay fails to meet the set-up time to the clocked register.

3. The timing-failure-predicting integrated circuit of claim 2 wherein the toggling functional critical path timing sensor comprises:
    a first register that receives an output of a toggling functional critical path;
    a compare gate that compares an output of the first register to the output of the toggling functional critical path to generate the fail signal when the output of the first register does not match the output of the toggling functional critical path;
    a second register that receives the output of the compare gate to generate the fail signal, the second register being clocked by a delayed clock.

4. The timing-failure-predicting integrated circuit of claim 2 wherein the toggling functional critical path timing sensor comprises:
    a margin delay buffer that receives an output of a toggling functional critical path;
    a first register that receives an output of the margin delay buffer;
    a second register that receives an input of the toggling functional critical path; and
    a compare gate that compares an output of the first register to an output of the second register to generate the fail signal when the output of the first register does not match the output of the second register.

5. The timing-failure-predicting integrated circuit of claim 4 wherein a margin delay through the margin delay buffer is variable.

6. The timing-failure-predicting integrated circuit of claim 4 wherein the toggling pattern generator is a toggle flip-flop that generates a transition on an output for each clock period.

7. The timing-failure-predicting integrated circuit of claim 4 wherein the toggling pattern generator is a Linear-Feedback-Shift Register (LFSR).

8. The timing-failure-predicting integrated circuit of claim 7 wherein a multi-path toggling functional critical path in the plurality of toggling functional critical paths comprises a plurality of converging paths that converge and are combined before being applied to one of the plurality of toggling functional critical path timing sensors;
    wherein the LFSR generates a plurality of outputs that are applied to the plurality of converging paths.

9. The timing-failure-predicting integrated circuit of claim 4 wherein the toggling functional critical paths comprise copies of functional critical paths that carry user data or control information during a normal operating mode of the timing-failure-predicting integrated circuit.

10. The timing-failure-predicting integrated circuit of claim 3 wherein the toggling functional critical paths comprise representational critical paths having a string of gates with a number of gates exceeding a maximum number of gates in any functional critical path in the timing-failure-predicting integrated circuit, or a gate with a fan-out exceeding a maximum fan-out of any functional critical path in the timing-failure-predicting integrated circuit.

11. The timing-failure-predicting integrated circuit of claim 10 wherein the toggling functional critical paths comprise representational critical paths that comprise:
    a string of gates;
    a gate with a high fan-out;
    a larger buffer with a high capacitive load; and
    a mux that receives outputs from the string of gates, from the gate with the high fan-out, and from the larger buffer, the mux selecting an output for testing by the toggling functional critical path timing sensor.

12. The timing-failure-predicting integrated circuit of claim 4 further comprising:
    a plurality of registers for storing internal signals in response to a clock;
    combinatorial logic between inputs and outputs of the plurality of registers; and
    a plurality of functional critical paths being among a top 10% of paths in the combinatorial logic sorted by delay;
    wherein the plurality of toggling functional critical paths are replicas of paths in the plurality of functional critical paths that are among the top 10% of paths in the combinatorial logic sorted by delay.

13. A process-compensating timing adjustor comprising:
a toggling pattern generator that generate patterns that accelerate testing;
a plurality of toggling functional critical paths that receive the patterns generated by the toggling pattern generator;
a plurality of toggling functional critical path timing sensors, each toggling functional critical path timing sensor receiving a delayed output from one of the plurality of toggling functional critical paths that is delayed by a variable delay buffer, each toggling functional critical path timing sensor activating a timing failure signal when the delayed output does not meet a set-up time to a clocked register;
a power-voltage controller that receives the timing failure signals from the plurality of toggling functional critical path timing sensors, the power-voltage controller increasing a power-supply voltage when a timing failure signal is received, the power-voltage controller decreasing the power-supply voltage when the timing failure signal is not received over a period of time,
whereby the power-supply voltage is adjusted in response to timing failures.

14. The process-compensating timing adjustor of claim 13 wherein the toggling pattern generator is a toggle flip-flop.

15. The process-compensating timing adjustor of claim 13 wherein the toggling pattern generator is a Linear-Feedback-Shift Register (LFSR).

16. The process-compensating timing adjustor of claim 13 wherein the toggling functional critical paths comprise copies of functional critical paths that carry user data or control information during a normal operating mode of the process-compensating timing adjustor.

17. The process-compensating timing adjustor of claim 13 wherein the toggling functional critical paths comprise representational critical paths having a string of gates with a number of gates exceeding a maximum number of gates in any functional critical path in an integrated circuit, or a gate with a fan-out exceeding a maximum fan-out of any functional critical path in the integrated circuit.

18. The process-compensating timing adjustor of claim 13 wherein each toggling functional critical path timing sensor comprises:
a reference register that clocks in an input to a toggling functional critical path;
a clocked register that clocks in the delayed output; and
a compare gate that compares an output of the reference register to an output of the clocked register to generate the timing failure signal.

19. A process-compensating chip comprising:
pattern generator means for generating patterns that have frequent transitions;
a plurality of toggling functional critical paths that receive the patterns generated by the pattern generator means, wherein transistors in the plurality of toggling functional critical paths are switched on and off by the patterns;
a plurality of toggling functional critical path timing sensors means, each toggling functional critical path timing sensor means for activating a timing failure signal when an output of a toggling functional critical path does not meet a set-up time to a clocked register, wherein the output is received from one of the plurality of toggling functional critical paths; and
power-voltage controller means, receiving the timing failure signal from the toggling functional critical path timing sensor means, for causing a power-supply voltage to be increased when the timing failure signal is received, and for causing the power-supply voltage to be reduced when no timing failure signal is received for a period of time,
wherein the power-supply voltage is adjusted to compensate for timing failures detected through the toggling functional critical paths.

20. The process-compensating chip of claim 19 wherein the power-voltage controller means is for periodically adjusting the power-supply voltage by:
when a timer expires and no timing failure signals are received, decreasing the power-supply voltage;
when a timing failure signal is received, increasing the power-supply voltage;
when the power-supply voltage reaches a limit, adjusting a frequency of a clock.

\* \* \* \* \*